United States Patent
Stahl

[19]

[11] Patent Number: 5,909,865
[45] Date of Patent: Jun. 8, 1999

[54] SUPPORT FOR A PRINTED CIRCUIT BOARD WITH ELECTRONIC COMPONENTS

[75] Inventor: Hermann Stahl, Steinheim/Kleinbottwar, Germany

[73] Assignee: Hermann Stahl GmbH, Grossbottwar, Germany

[21] Appl. No.: 08/975,798

[22] Filed: Nov. 21, 1997

[30] Foreign Application Priority Data

Nov. 21, 1996 [DE] Germany ............................ 196 48 205

[51] Int. Cl.⁶ .................................................. B01D 17/00
[52] U.S. Cl. ..................................... 248/346.03; 361/784
[58] Field of Search ........................ 248/346.03, 346.04, 248/346.01, 346.06, 345.1; 361/784, 804, 707, 803, 417, 774; 269/21

[56] References Cited

U.S. PATENT DOCUMENTS

| | | | |
|---|---|---|---|
| 2,651,833 | 9/1953 | Kernahan | 29/837 |
| 2,931,003 | 3/1960 | Huetten et al. | 361/784 |
| 3,097,032 | 7/1963 | Hochheiser | 361/784 |
| 3,323,091 | 5/1967 | Hibbits | 336/84 R |
| 3,447,039 | 5/1969 | Branagan | 361/774 |
| 4,901,204 | 2/1990 | Hayashi | 361/417 |
| 5,019,948 | 5/1991 | Steketee et al. | 361/802 |
| 5,067,695 | 11/1991 | Huddleston | 269/21 |
| 5,368,802 | 11/1994 | Wanha | 264/249 |
| 5,491,614 | 2/1996 | Fowler et al. | 361/784 |
| 5,715,141 | 2/1998 | Karlsson | 361/707 |
| 5,754,409 | 5/1998 | Smith | 361/803 |
| 5,770,300 | 6/1998 | Okamoto et al. | 428/209 |
| 5,838,548 | 11/1998 | Matz et al. | 361/784 |

FOREIGN PATENT DOCUMENTS

| | | | |
|---|---|---|---|
| 215801 | 7/1958 | Australia | 361/804 |
| 547618A1 | 12/1992 | European Pat. Off. | 361/804 |
| 8422203 | 10/1984 | Germany . | |
| 9110871 | 12/1991 | Germany . | |

*Primary Examiner*—Leslie A. Braun
*Assistant Examiner*—Tan Le
*Attorney, Agent, or Firm*—Robert W. Becker & Associates

[57] ABSTRACT

The support for a printed circuit board, positioned at a distance parallel to the support, includes a base plate and spacers for spacing the printed circuit board from the base plate. The spacers have a head for connecting the spacers to the printed circuit board. The spacers have a bottom portion connected to fastening elements of the base plate provided at a side facing the printed circuit board. The bottom portions are flat and parallel to the base plate. The fastening elements have securing projections for the bottom portions. Each bottom portion has at least two edges engaged by the securing projections. The fastening elements have abutments for the bottom portions, wherein the bottom portions rest at the abutments when engaged by the securing projections.

12 Claims, 5 Drawing Sheets

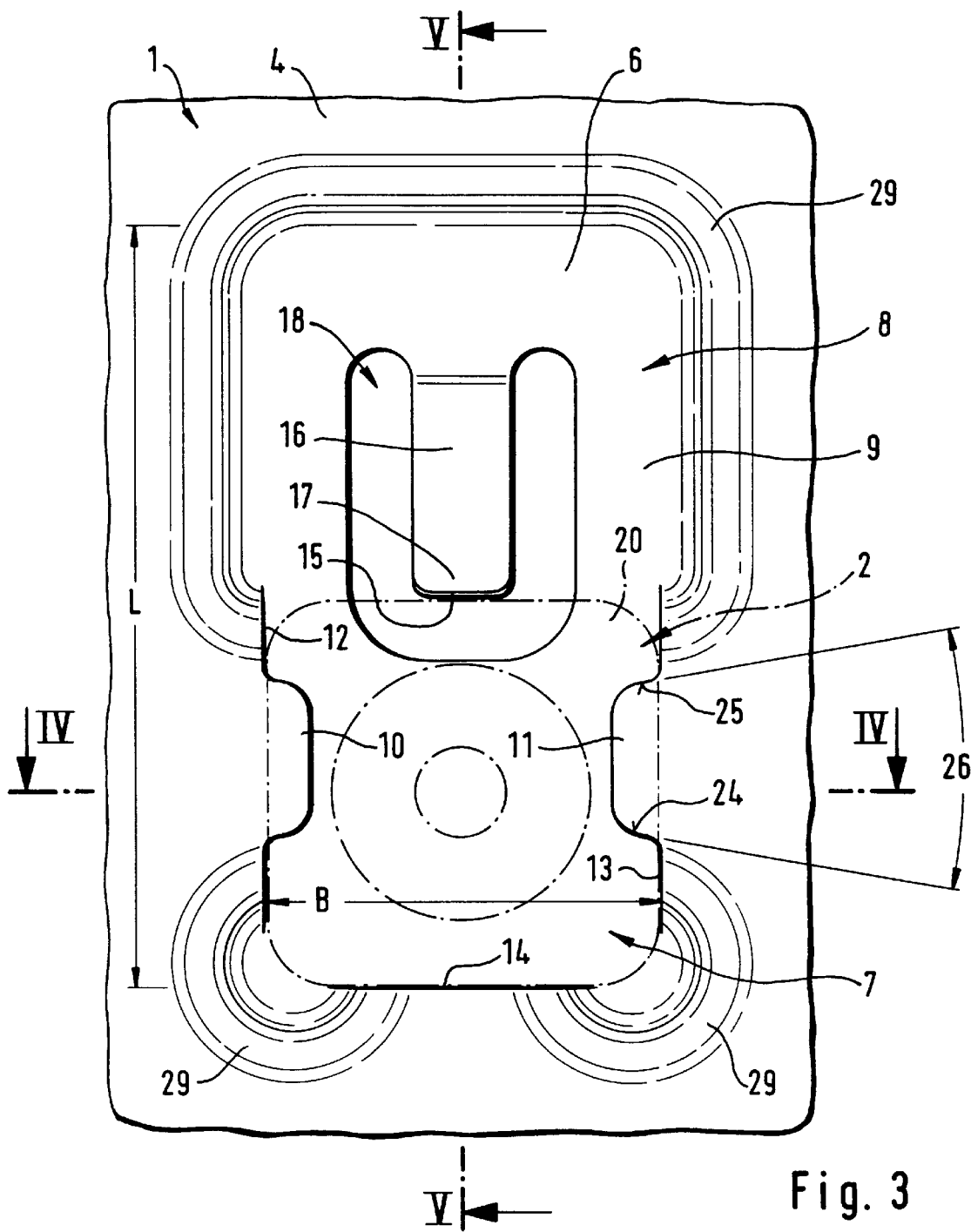
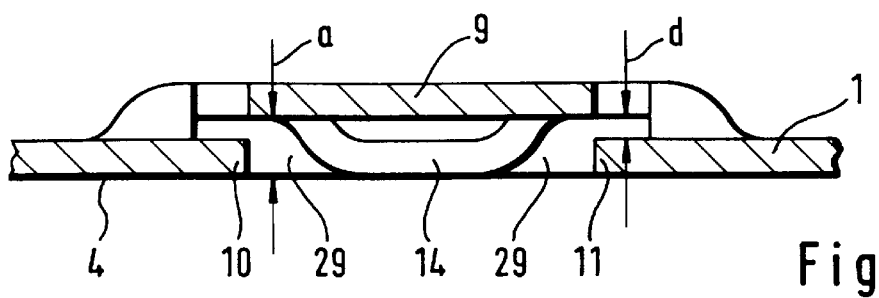
Fig. 3
Fig. 4

SUPPORT FOR A PRINTED CIRCUIT BOARD WITH ELECTRONIC COMPONENTS

BACKGROUND OF THE INVENTION

The present invention relates to a support, provided with spacers, for a printed circuit board with electronic components to be secured in a parallel arrangement thereat, whereby each spacer has a bottom portion secured at the side of the support facing the printed circuit board and a head for securing the spacers at a fastening location of the printed circuit board.

Such supports are, for example, used in computer housings for securing the main board there in. The support is not only provided for securely attaching the main board within the computer housing but also for compensating forces occurring during insertion or replacement of plug-in cards. In this context, the arrangement of the fastening elements between the support and the printed circuit board with electronic components has an especially important role. The possible fastening locations, however, can not be selected only according to the mechanical requirements, but must be positioned within free spaces that will remain after arrangement of the electronic components. This has resulted in main boards of different manufactures or of different configurations (AT, ATX) requiring different locations for the fastening elements. The fastening locations at the support must be provided accordingly.

For fastening a printed circuit board to the selected fastening points at the support, spacers are used into which a threaded screw is inserted from the side of the support as well from the side of the printed circuit board. The manufacture of such spacers as well as their mounting are thus time consuming and expensive.

It is therefore an object of the present invention to embody a support of the aforementioned kind such that spacers of a simple construction can be secured with minimal mounting expenditures at selected fastening points or elements of the support.

SUMMARY OF THE INVENTION

The support for a printed circuit board, positioned at a distance parallel to the support, according to the present invention is primarily characterized by:

A base plate;

Spacers for spacing the printed circuit board from the base plate;

The spacers having a head for connecting the spacers to the printed circuit board;

The spacers having bottom portion;

The base plate having a side facing the printed circuit board;

The base plate having fastening elements for securing each one of the bottom portions to the side;

The bottom portions being flat and parallel to the base plate;

The fastening elements having securing projections for the bottom portions;

Each one of the bottom portions having at least two edges engaged by the securing projections;

The fastening elements having abutments for the bottom portions, wherein the bottom portions rest at the abutments when engaged by the securing projections.

Advantageously, the securing projections and the abutments are stamped from the base plate.

The fastening elements expediently have a spring tongue stamped from the base plate, wherein one of the abutments is located at the free end of the spring tongue.

The bottom portions are rectangular or square.

The spacers have a cylindrical sleeve portion, and the head and the bottom portion are at opposite ends of the sleeve portion. The bottom portion preferably surrounds the sleeve portion and laterally projects therefrom.

The head is preferably an inwardly rolled end of the sleeve portion. The spacers are preferably stemmed from a single piece of sheet metal.

The securing projections and the abutments are advantageously located within the plane of the base plate or project from the plane of the base plate.

The fastening elements include a depression stamped into the baseplate. The depression has a bottom that is positioned at a distance below the side of the base plate facing the printed circuit board.

The plate-shaped bottom portion of the spacers can be simply produced by stamping so that the spacers can be produced inexpensively as a mass-produced part. The insertion of the plate-shaped (flat) bottom portion into a position below the securing projections of the support, i.e., its base plate, and the engagement of the bottom portion at the abutments of the support ensures assembly without requiring tools so not only the actual manufacture but also later retrofitting can be performed with minimal expenditure for arranging respective spacers at selected fastening locations of the base plate corresponding to fastening locations of the printed circuit board.

Preferably, the securing projections and also the abutments are stamped from the base plate. Thus, when manufacturing the base plate a stamping step can be simultaneously used for producing a plurality of fastening elements so that various types of printed circuit boards can be connected thereto. The stamping of the securing projections does not weaken the base plate so that, even when a great number of fastening elements is provided at the base plate, its mechanical stability is not compromised.

Preferably, one of the abutments is provided at the free end (leading end) of a stamped spring tongue which provides a catch connection for the spacer at the mounting seat of the fastening element.

Preferably, the plate-shaped or flat bottom portion of the spacer has a substantially rectangular, especially square, shape. The plate-shaped bottom portion is positioned as a frame about the lower end of a cylindrical sleeve portion. The head of the spacer is preferably provided by an inwardly rolled end of the sleeve portion. The spacer with its bottom portion and its head can be produced by stamping from a single piece of sheet metal so that the spacer can be mass-produced with minimal expenditure.

Preferably, the securing projections are positioned within the plane of the support or base plate, i.e., the securing projections do not project past the outer side of the base plate facing the printed circuit board. The thus formed mounting seat does not require mounting space between the support (base plate) and the printed circuit board so that even when mounting a printed circuit board with minimal spacing at the support, a sufficient air space for cooling of the electronic components is provided. Such tight mounting or assembly also ensures that the entire arrangement or configuration of support (base plate) and printed circuit board requires only minimum mounting space within the computer housing, especially in PCs (personal computers).

Preferably, the mounting seat for the bottom portion of the spacer is stamped into the base plate of the support.

BRIEF DESCRIPTION OF THE DRAWINGS

The object and advantages of the present invention will appear more clearly from the following specification in conjunction with the accompanying drawings in which:

FIG. 3 is a plan view of a mounting seat of the base plate according to detail III of FIG. 1;

FIG. 4 shows a section along the line IV—IV of FIG. 3;

DESCRIPTION OF PREFERRED EMBODIMENTS

The present invention will now be described in detail with the aid of several specific embodiments utilizing FIGS. 1 through 10.

Figure 1:
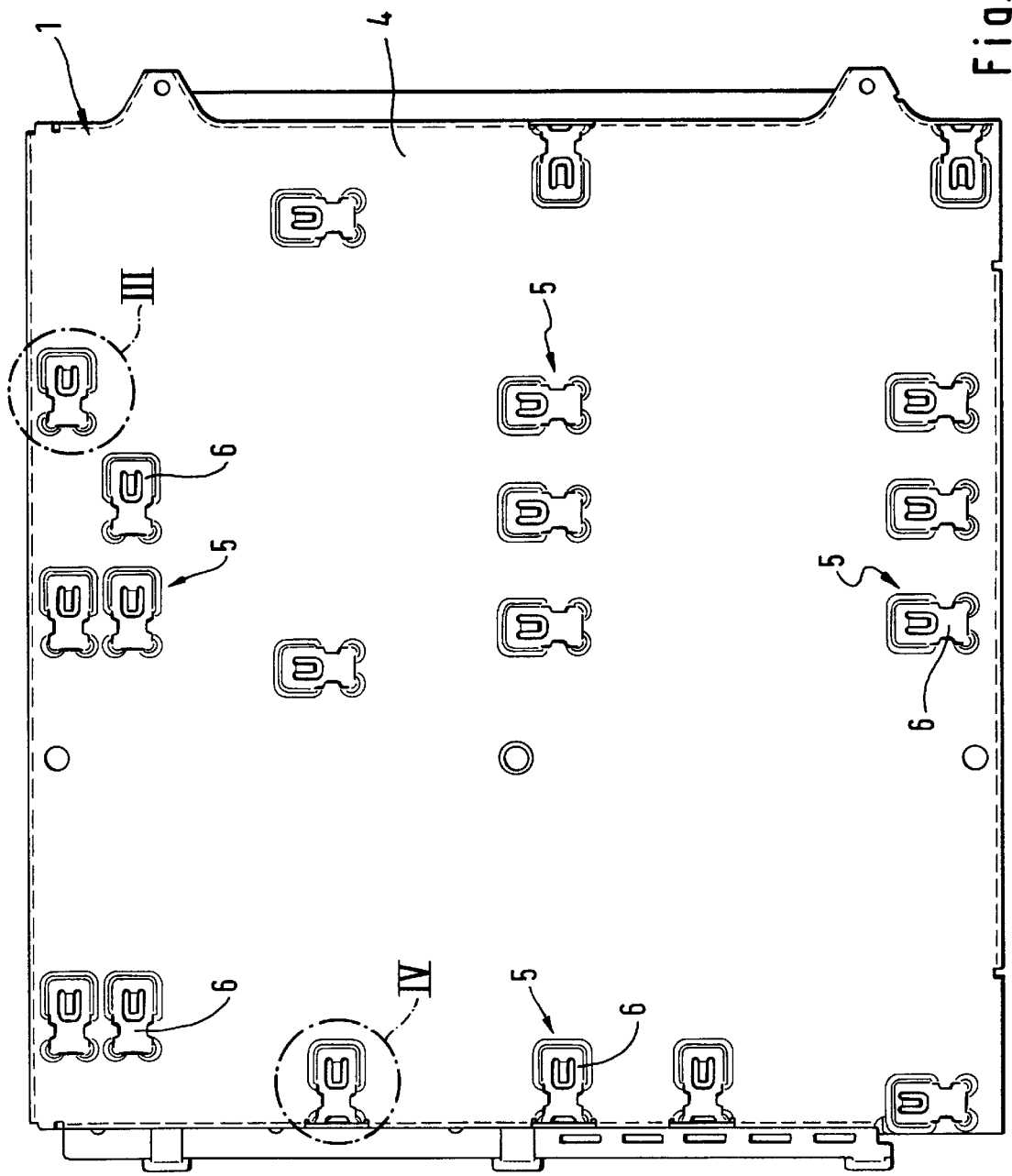
FIG. 1 shows a plan view of the inventive base plate of the support.
Figure 2:
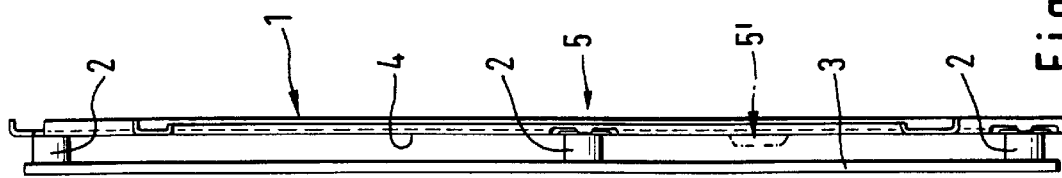
FIG. 2 shows a side view of the base plate of FIG. 1 with printed circuit board attached thereto.
Figure 5:
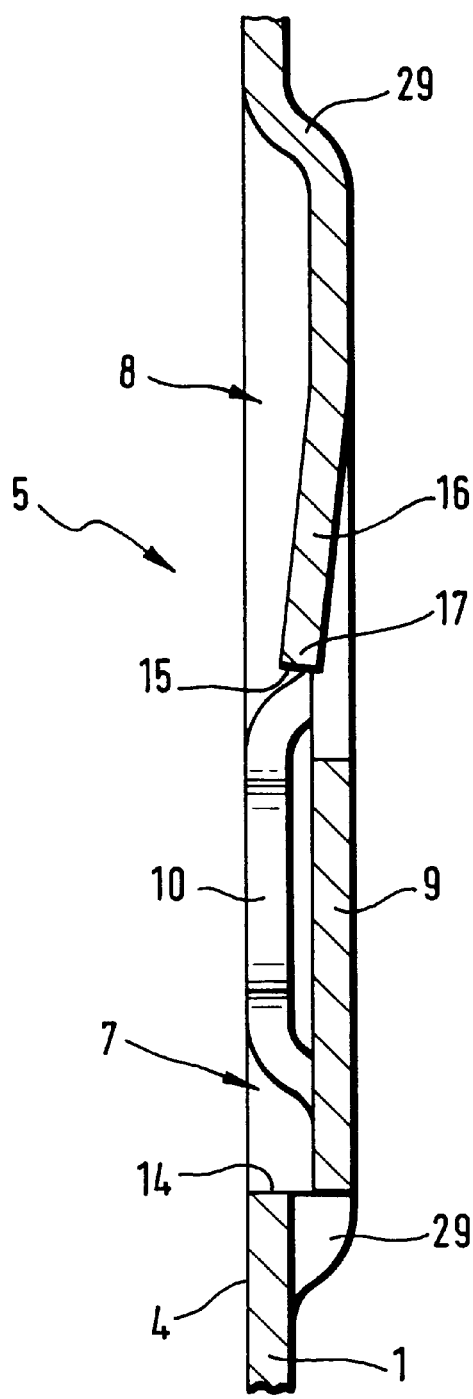
FIG. 5 shows a section along the line V—V of FIG. 3.

The base plate 1 of the support represented in FIG. 1 is comprised of sheet metal, especially coated sheet metal, which for greater stiffness is provided with angled longitudinal edges. As shown schematically in FIG. 2, a printed circuit board 3 is attached to the base plate of the support by spacers 2 whereby the printed circuit board 3 is provided with non-represented electronic components. The printed circuit board 3 is especially the main board, (mother board) of a computer, for example, a personal computer.

In order to be able to use the same type of base plate 1 for different types of main boards with different arrangements of fastening locations, according to the present invention the outer side 4 of the support (base plate 1) facing the printed circuit board 3 is provided with a plurality of fastening elements or mounting seats 5 which, depending on the printed circuit board 3 to be secured and its fastening locations, is provided with respectively distributed spacers 2.

Each mounting seat or fastening element 5 is provided in the form of a depression 6 stamped out of the plane of the base plate 1 such that the bottom 9 of the depression 6 is positioned at a distance 8 below the outer side 4 of the base plate 1 facing the printed circuit board 3. The stamped depression 6 serves to receive the plate-shaped bottom portion 20 of the spacer 2 which is shown in detail in FIGS. 9 and 10. The spacer 2 is comprised substantially of a cylindrical sleeve portion 21 having a bottom portion that in plan view is rectangular, especially square, in shape. It forms a frame about the cylindrical sleeve portion 21. The head 22 of the spacer 2 is embodied as an inwardly rolled end provided with a central opening 23 for receiving a self-shaping threaded screw. In order to ensure sufficient engaging of the threaded screw, the opening 23 has a length l which corresponds to approximately a quarter of the entire length of the spacer 2.

Figure 9:
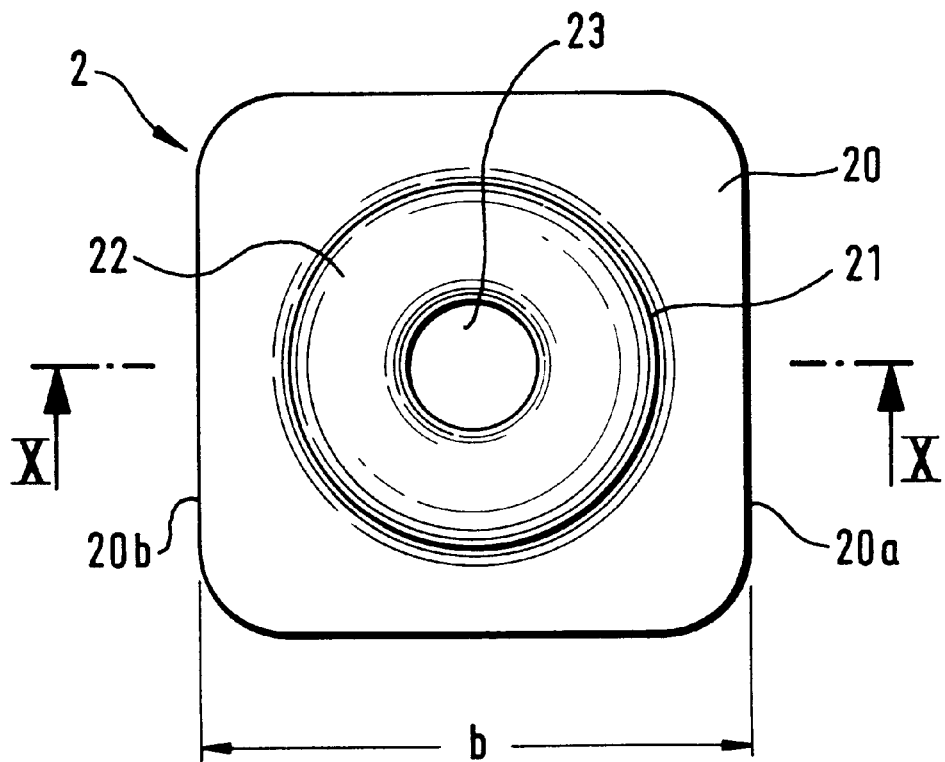
FIG. 9 shows a plan view of a spacer for the base plate according to FIG. 1.

As shown in FIG. 9, the corners of the plate-shaped frame bottom portion 20 is rounded so that the insertion into the mounting seat (fastening element) 5 is facilitated, which will be explained in the following. The depression 6 provided within the base plate 1 as part of the fastening element or mounting seat 5 has a width B that is slightly greater than the edge length b of the preferably square frame of the bottom portion 20. The length L of the depression corresponds approximately to twice the edge length b of the square bottom portion 20. The square construction of the bottom portion 20 allows the insertion of the spacer 2 in any position into the mounting seat 5. In general, the spacer 2 only requires two edges 20a, 20b which are to be engaged by the securing projections 10, 11.

The depression 6 can be divided transverse to its length L into a mounting section 8 and a seat section 7. The seat section 7 comprises at its longitudinal edges 12 and 13 a respective securing projection 10 and 11 which face one another and are positioned in the plane of base plate 1. The securing projections 10 and 11 are positioned, as shown in FIG. 4, at a spacing d to the bottom 9 of the depression 6 which is slightly greater than the thickness D (FIG. 10) of the plate-shaped bottom portion 20. The end face or edge 14 extending transverse to the longitudinal edges 12 and 13 forms an abutment for the plate-shaped bottom 20 of the spacer 2. The opposite end face is delimited by the abutment 15 within the seat section 7. This abutment 15 is provided at the free end 17 of the spring tongue 16. The spring tongue 16 is delimited by a U-shaped cutout 18 within the bottom 9 of the mounting section 8. During stamping of the entire mounting seat 5, the spring tongue 16 is simultaneously forced out of the plane of the bottom 9 into the depression 6. The free end 17 of the spring tongue 16 is positioned at a small spacing to the outer side 4 of the base plate 1, as shown in the drawings.

According to the invention, the fastening element (mounting seat) 5 is stamped during manufacture of the support into the base plate 1 whereby the bottom 9 is formed as a unitary part of the base plate 7 to which it is connected by wider deformation strips 29. Only in the area of the securing projections 10 and 11 as well as in the area of the edge at the end face that forms abutment 14, the bottom 9 is separated from the base plate 1. The securing projections 10 and 11 as well as the abutment 14 are positioned within the plane of the base plate 1, respectively, its outer side 4.

The securing projections 10 and 11 are positioned away from the center of the mounting section 7 in order to provide at the corners of the longitudinal edges 12 and 13 connected to the transverse end face 14 a sufficiently wide deformation section 29. The deformation section 29 ensures a material-save deformation that prevents fractures etc. The securing projections 10 and 11 engage approximately half the length of the respective facing edges 20a, 20b of the bottom portion 20. The flanks 24 and 25 of the securing projections 10, 11 extending transverse to these edges 20a, 20b are positioned at an angle 26 of approximately 20° to one another. The size of the mounting section 8 of the mounting seat 5 corresponds preferably to the dimensions of the bottom portion 20 of the spacer 2. Since the bottom 9 of the mounting section 8 substantially has a transition over its entire circumference into the deformation section 29 of the base plate 1, a funnel shape results which facilitates the insertion of the spacer 2 with its bottom portion 20 into the mounting section 8. The spacer 2 is then pressed downwardly against the force of the spring tongue 16 and moved in the direction toward the end face 14 below the securing projections 10 and 11 until the spring tongue 16 can return to its initial position and thus secure the bottom portion 20, respectively, the spacer 2 in its position under the securing projections 10 and 11.

Figure 8:
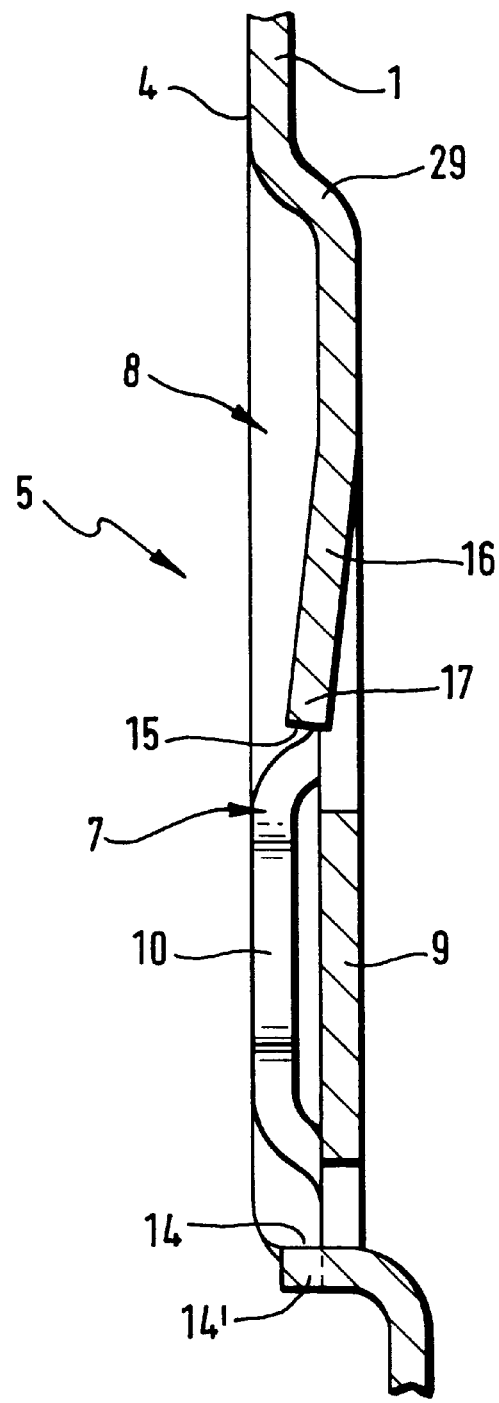
FIG. 8 shows a section along the line VIII—VIII of FIG. 6.
Figure 6:
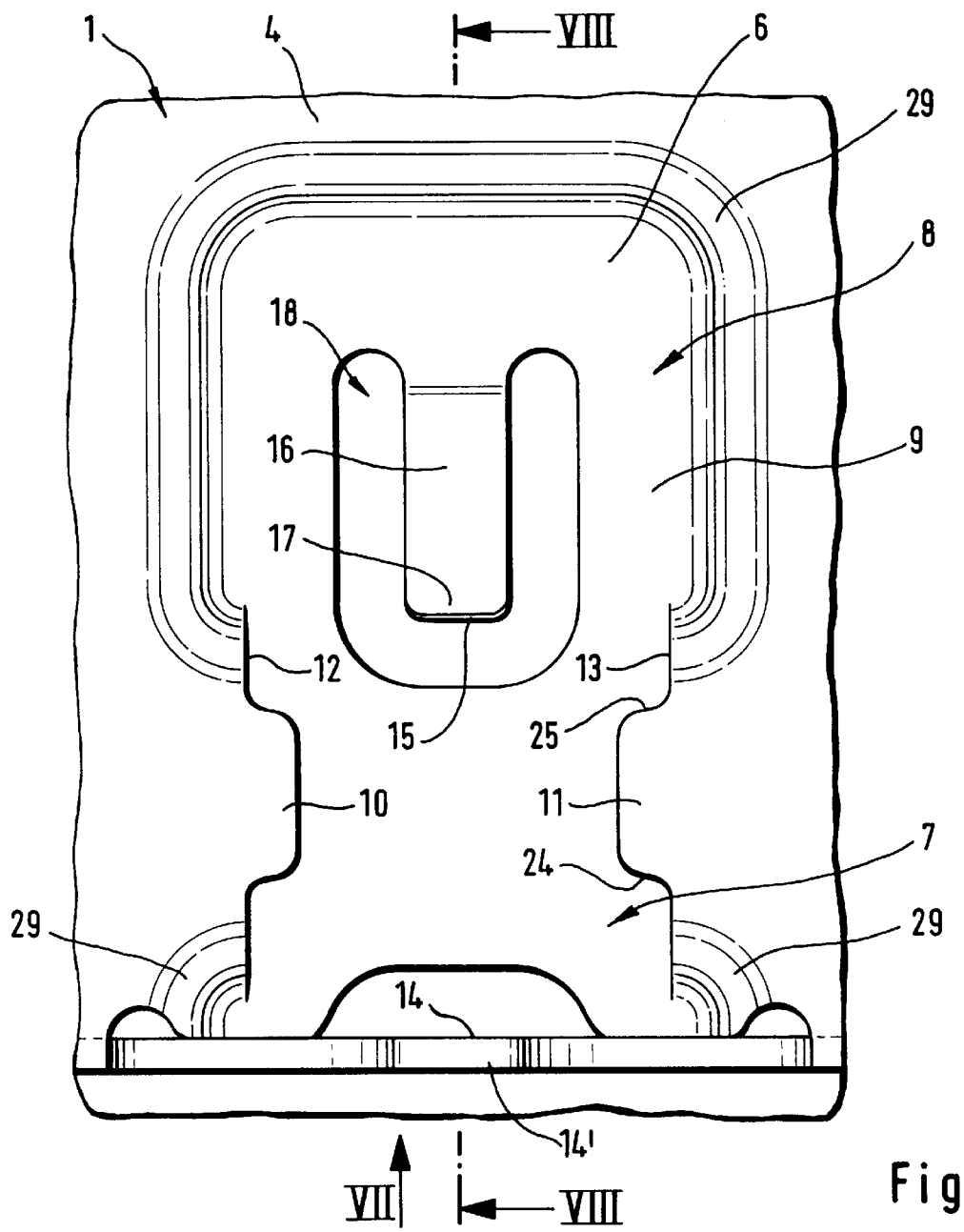
FIG. 6 is a plan view of a mounting seat of the base plate according to detail VI of FIG. 1.
Figure 7:
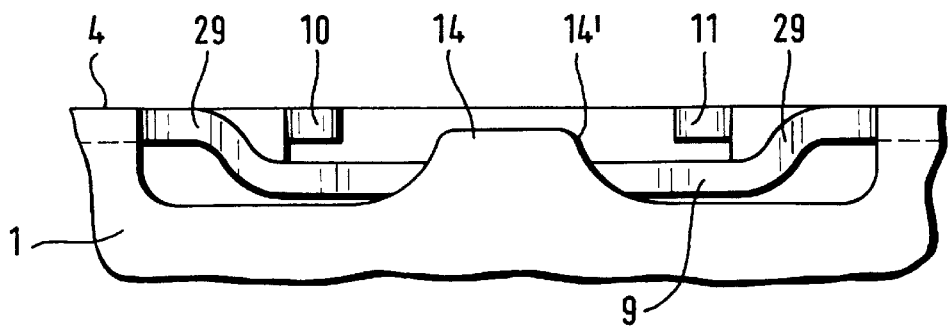
FIG. 7 is a view of the mounting seat according to arrow VII of FIG. 6.
Figure 10:
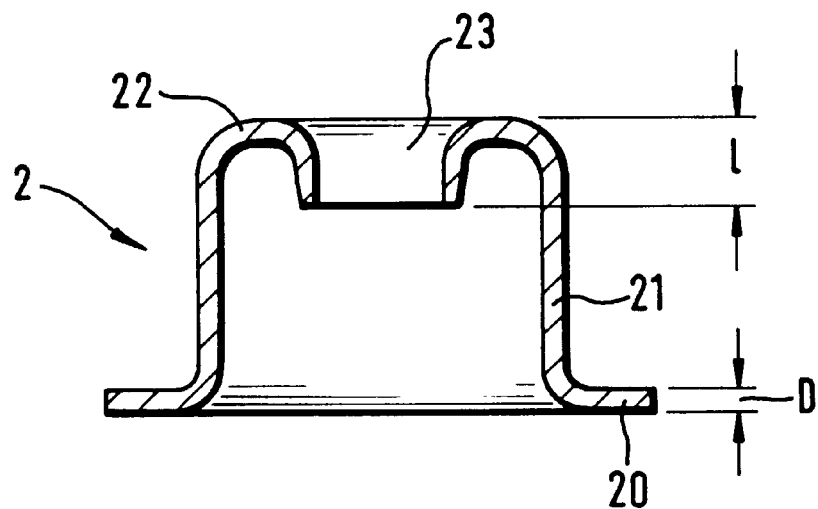
FIG. 10 shows a section along the line X—X of FIG. 9.

When a mounting seat (fastening element) 5 is positioned in the vicinity of the outer edge 14, of the base plate 1, an arrangement is provided such that the angled outer edge 14, forms at the same time the abutment 14 of the mounting seat 5. As shown in FIGS. 6 through 8, the end face 14 is aligned with the angled outer edge 14, of the base plate 1 so that the deformation zones of the end face 14 into the base plate 1 are obsolete. However, a sufficient stability is still ensured.

The specification incorporates by reference the disclosure of German priority document 196 48 205.4 of Nov. 21, 1996.

The present invention is, of course, in no way restricted to the specific disclosure of the specification and drawings, but also encompasses any modifications within the scope of the appended claims.

What is claimed is:

1. A support having a printed circuit board positioned at a distance parallel to said support, said support comprising:

a base plate;

spacers for spacing the printed circuit from said base plate;

said spacers having a head for connecting said spacers to the printed circuit board;

said spacers having a bottom portion;

said base plate having a side facing the printed circuit board;

said base plate having fastening elements for securing each one of said bottom portions to said side;

said bottom portions being flat and parallel to said base plate;

said fastening elements having securing projections for said bottom portions;

each one of said bottom portions having at least two edges engaged by said securing projections;

said fastening elements having abutments for said bottom portions, wherein said bottom portions rest at said abutments when engaged by said securing projections.

2. A support according to claim 1, wherein said securing projections and said abutments are stamped from said base plate.

3. A support according to claim 1, wherein said fastening elements have a spring tongue stamped from said base plate and wherein one of said abutments is located at a free end of said spring tongue.

4. A support according to claim 1, wherein said bottom portions are rectangular.

5. A support according to claim 1, wherein said bottom portions are square.

6. A support according to claim 1, wherein:

said spacers have a cylindrical sleeve portion;

said head and said bottom portion are at opposite ends of said sleeve portion; and said bottom portion surrounds said sleeve portion and laterally projects therefrom.

7. A support according to claim 1, wherein said head is an inwardly rolled end of said sleeve portion.

8. A support according to claim 1, wherein said spacers are stamped from a single piece of sheet metal.

9. A support according to claim 1, wherein said securing projections and said abutments are located within a plane of said base plate.

10. A support according to claim 1, wherein said securing projections and said abutments project from a plane of said base plate.

11. A support according to claim 1, wherein said fastening elements include a depression stamped into said base plate.

12. A support according to claim 11, wherein said depression has a bottom that is positioned at a distance below said side.

* * * * *